United States Patent
Kim

(10) Patent No.: US 8,395,170 B2
(45) Date of Patent: Mar. 12, 2013

(54) LIGHT EMITTING DEVICE PACKAGE AND LIGHT UNIT HAVING THE SAME

(75) Inventor: Hye Young Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 215 days.

(21) Appl. No.: 12/880,683

(22) Filed: Sep. 13, 2010

(65) Prior Publication Data

US 2011/0175122 A1  Jul. 21, 2011

(30) Foreign Application Priority Data

Jan. 20, 2010 (KR) .................. 10-2010-0005199

(51) Int. Cl.
*H01L 33/00* (2010.01)
(52) U.S. Cl. .... 257/98; 257/103; 257/324; 257/E33.068
(58) Field of Classification Search .............. 257/98, 257/103, 324, E33.068
See application file for complete search history.

(56) References Cited

U.S. PATENT DOCUMENTS

| | | | |
|---|---|---|---|
| 5,821,615 A | 10/1998 | Lee | |
| 2003/0178691 A1 | 9/2003 | Wang et al. | |
| 2006/0054910 A1 | 3/2006 | Takemori et al. | |
| 2007/0241342 A1 | 10/2007 | Inoue et al. | |
| 2008/0048206 A1* | 2/2008 | Lee et al. | 257/103 |
| 2008/0217635 A1* | 9/2008 | Emerson et al. | 257/98 |
| 2008/0251287 A1 | 10/2008 | Shiraishi et al. | |
| 2009/0230417 A1* | 9/2009 | Tsai et al. | 257/98 |
| 2009/0289272 A1 | 11/2009 | Kim | |

FOREIGN PATENT DOCUMENTS

| | | |
|---|---|---|
| CN | 101123286 | 2/2008 |
| EP | 1876653 | 1/2008 |
| JP | 2008-258322 | 10/2008 |
| JP | 3155112 U | 10/2009 |
| KR | 10-0678860 | 1/2007 |
| KR | 10-2007-0034251 | 3/2007 |
| KR | 10-0877881 B1 | 1/2009 |
| KR | 10-2009-0011121 | 2/2009 |
| WO | WO 2009/014376 | 1/2009 |

* cited by examiner

*Primary Examiner* — Jerome Jackson, Jr.
*Assistant Examiner* — Dale E Page
(74) *Attorney, Agent, or Firm* — McKenna Long & Aldridge LLP

(57) ABSTRACT

A light emitting structure includes a package body including a conductive material, a nonconductive layer formed on a surface of the package body, a plurality of electrodes on the nonconductive layer, a plurality of protrusions from the electrodes, a light emitting device mounted to a plane of the package body and connected to the electrodes, and a transmissive resin member to encapsulate the light emitting device wherein at least the plane of the package body other than where the light emitting device is seated is substantially flat.

16 Claims, 5 Drawing Sheets

LIGHT EMITTING DEVICE PACKAGE AND LIGHT UNIT HAVING THE SAME

CROSS-REFERENCE TO RELATED APPLICATIONS

The present application claims priority under 35 U.S.C. 119 to Korean Patent Application No. 10-2010-0005199 (filed on Jan. 20, 2010), which is hereby incorporated by reference in its entirety as if fully set forth herein.

BACKGROUND

The embodiment relates to a light emitting device package and a light unit having the same.

A light emitting diode (LED) is a semiconductor light emitting device that converts current into light. Recently, the brightness of the LED has increased, so that the LED has been employed as a light source for a display device, a vehicle, or a lighting device. In addition, the LED can represent a white color having superior light efficiency by employing phosphors or combining LEDs having various colors.

In order to increase the brightness and the performance of the LED, a light extraction structure, the structure of an active layer, current diffusion, the structure of an electrode, and the structure of a light emitting diode package have been improved.

SUMMARY

The embodiment provides a light emitting device package having improved light efficiency and a light unit having the same. The embodiment provides a light emitting device package including a plurality of protrusions on a body including a conductive material and a light unit having the same.

The embodiment provides a light emitting device package including a plurality of protrusions protruding from a nonconductive layer, electrodes, and a light unit having the same.

The embodiment provides a light emitting device package having improved reliability and a light unit.

According to the embodiment, a light emitting structure includes a package body including a conductive material, a nonconductive layer formed on a surface of the package body, a plurality of electrodes on the nonconductive layer, a plurality of protrusions protruding from the electrodes, a light emitting device mounted to a plane of the package body and connected to the electrodes, and a transmissive resin member to encapsulate the light emitting device, wherein at least the plane of the package body other than where the light emitting device is seated is substantially flat.

According to the embodiment, a light emitting device package includes a package body including a cavity, in which a top portion is opened, and a conductive material, a nonconductive layer on a surface of the package body, and including a plurality of protrusions in the cavity, a plurality of electrodes on the nonconductive layer that follow a contour of the protrusions, and a light emitting device provided in the cavity and connected to the electrodes, wherein at least a bottom surface of the cavity other than where the light emitting device is seated is substantially flat.

According to the embodiment, a light unit includes a plurality of light emitting device packages, a substrate arranged in the light emitting device packages, an optical member provided at one side of the substrate and including at least one of a light guide plate and an optical sheet, and a cover covering outer peripheral portions of the substrate and the optical member wherein the light emitting device package includes a package body including a conductive material, a nonconductive layer on a surface of the package body, a plurality of electrodes on the nonconductive layer, a plurality of protrusions from the electrodes, a light emitting device connected to the electrodes, and a transmissive resin member to encapsulate the light emitting device.

DETAILED DESCRIPTION OF THE EMBODIMENTS

Figure 1:
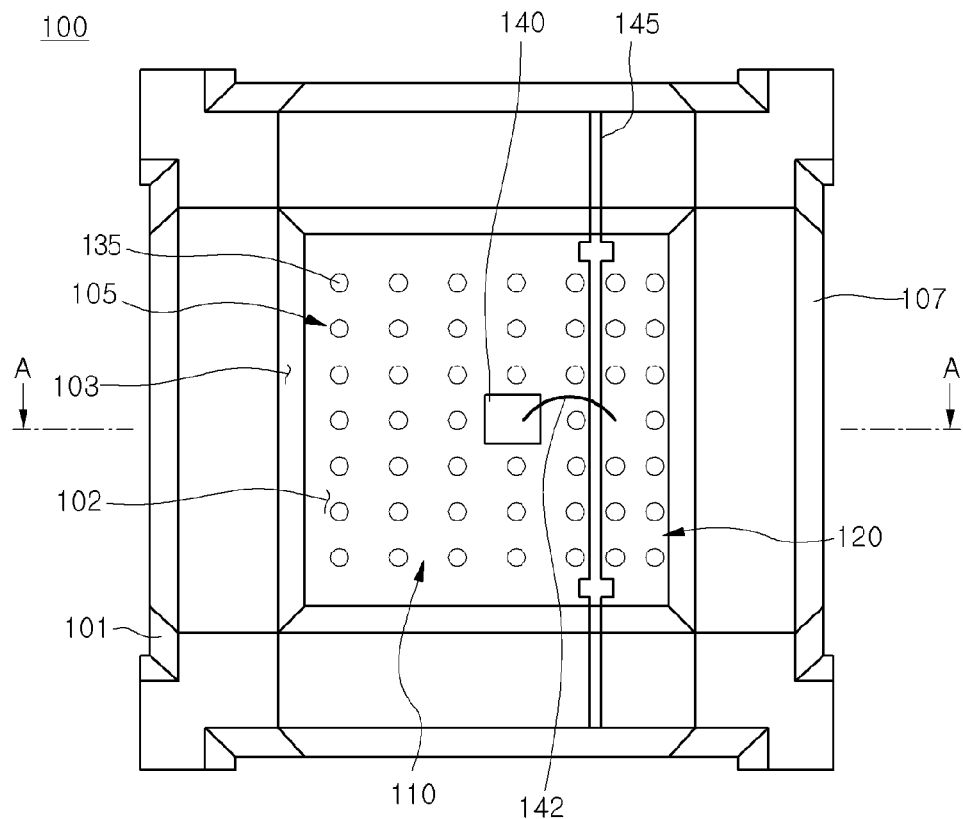
FIG. 1 is a plan view showing a light emitting device package according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, the embodiment will be described with reference to accompanying drawings. The thickness and size of each layer shown in the drawings may be exaggerated, omitted or schematically drawn for the purpose of convenience or clarity. In addition, the size of elements does not utterly reflect an actual size.

Figure 2:
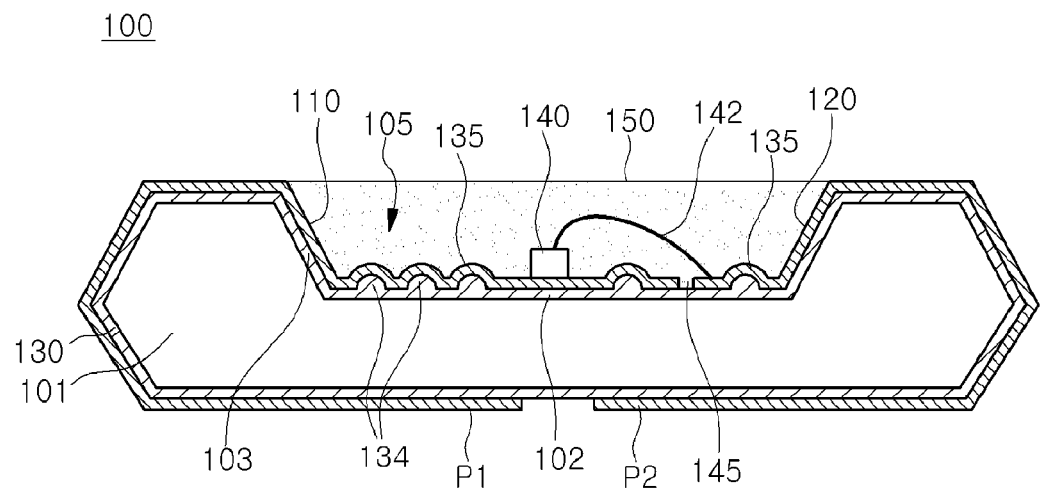
FIG. 2 is a side sectional view showing the light emitting device package of FIG. 1.

FIG. 1 is a plan view showing a light emitting device package 100 according to a first embodiment, and FIG. 2 is a sectional view taken along line A-A of FIG. 1.

Referring to FIGS. 1 and 2, the light emitting device package 100 includes a package body 101, a first electrode 110, a second electrode 120, a nonconductive layer 130, a concave-convex structure 135, and a light emitting device 140.

The package body 101 may include a conductive wafer such as a wafer level package (WLP) including silicon (Si). The package body 101 may include aluminum (Al), aluminum nitride (AlN), AlOx, photo sensitive glass (PSG), sapphire ($Al_2O_3$), beryllium oxide (BeO), printed circuit board (PCB), or various resins, in addition to Si. Hereinafter, according to the embodiment, description will be made regarding a case in which the package body 101 includes Si representing superior performance in the manufacturing efficiency and heat dissipation efficiency of the light emitting device package.

The package body 101 may be etched through a bulk etching scheme as an etching process. In addition, as the etching process, a wet etching scheme, a dry etching scheme, and a laser drilling scheme may be used. At least two among the etching schemes may be used together. A deep reactive ion etching scheme may be employed as the representative scheme of the dry etching scheme.

A cavity 105 may be formed with a predetermined depth at an upper portion of the package body 101 through an etching process. The cavity 105 may include one of a bath tub shape recess, a polygonal recess, and a circular recess, but the embodiment is not limited thereto. The cavity may be formed by using wet etchants including anisotropic wet etchants such as a potassium hydroxide (KOH) solution, a Tetramethylammonium hydroxide (TMAH) solution, and an Ethylene Diamine Pyrochatechol (EDP) solution after a micro-pattern has been formed. The cavity 105 may not be formed.

A lateral surface 103 of the cavity 105 in the package body 101 may be inclined at a predetermined angle or a predetermined curvature with respect to a cavity bottom surface, or may be vertically formed, but the embodiment is not limited thereto. An outer lateral surface 107 of the package body 101 may be inclined at a predetermined angle or may be vertically formed. The surface of the package body 101 is etched or cut at an angle according to the crystalline characteristic of a package body 101.

The insulating layer 130 is formed on the surface of the package body 101. For example, the insulating layer 130 may include one selected from the group consisting of silicon thermal oxides (e.g., $SiO_2$ and $SixOy$), aluminum oxide (e.g., AlOx), silicon nitrides (e.g., $Si_3N_4$, SixNy, and SiOxNy), alumina (e.g., AlN), and $Al_2O_3$.

The insulating layer 130 insulates the package body 101 from the electrode layers 110 and 120.

A plurality of protrusions 134 protrude from the insulating layer 130 provided on the bottom surface of the cavity 105, and the protrusions 134 protrude from the bottom surface of the cavity 105 and an opposite surface thereof while being spaced apart from each other.

The protrusion 134 may have a side section having a lens shape, a hemispherical shape, or a dome shape. The protrusion 134 may have a diameter within the range of a few micrometers (μm) (e.g. 0.1~9 μm), and have a height of a few micrometers (μm) to a few tens micrometers (μm) (e.g. 1-90 μm). In addition, the protrusion 134 may have a height lower than a top surface of the light emitting device 140.

The protrusions 134 may include a material the same as that of the insulating layer 130. In order to form the protrusions 134 from the insulating layer 130, after forming the insulating layer 130 at a predetermined thickness, a photoresist layer is coated through a photolithography process, and an exposure and development process is performed to pattern a selected region such that the selected region is exposed. Therefore, the selected region is formed in the structure of a protrusion. The protrusions 134 of the insulating layer 130 may be formed through another scheme. According to another scheme, after providing a photoresist layer, the protrusion 134 is formed or a wet etching scheme can be performed. The protrusions 134 may be formed at a regular interval or an irregular interval.

The insulating layer 130 may be deposited through a sputtering scheme or an e-beam deposition scheme, but the embodiment is not limited thereto.

At least one well may be formed in the package body 101, and the well may be formed in the package body 101 by implanting impurities or through a diffusion process. The well is connected to at least one of the electrodes 110 and 120 in the structure of a circuit, and may be realized by using a protective device such as a zener diode or a constant current device.

A plurality of electrode layers 110 and 120 may be formed on the insulating layer 130. Hereinafter, according to the embodiment, a structure in which the electrode layers 110 and 120 are formed will be described as an example. The electrode layers 110 and 120 may have a stack structure of a plurality of metallic layers based on thermal conductivity, electrical characteristics, light reflection efficiency, and the manufacturing process.

The electrode layers 110 and 120 may be formed by coating a photoresist layer on a selected region and patterning the selected region through an exposure and development process such that the selected region is exposed, thereby forming metallic layers. In addition, the electrode layers 110 and 120 may be formed by performing a patterning process after the metallic layers have been formed, but the embodiment is not limited thereto.

The first electrode layer 110 may be spaced apart from the second electrode layer 120. The first and second electrode layers 110 and 120 may be physically separated from each other by using a separator 145. The separator 145 may extend from an inner part of the cavity 105 to a top surface of the package body 110. The separator 145 may have the form of a groove and may include an insulating material. The separator 145 may have various structures or various shapes, but the embodiment is not limited thereto.

The first and second electrode layers 110 and 120 may be formed on the insulating layer 130, or may extend to one side and an opposite side of the package body 101. In addition, the first and second electrode layers 110 and 120 may extend to both sides of a bottom surface of the package body 101.

An end portion P1 of the first electrode layer 110 and an end portion P2 of the second electrode layer 120 may be used as electrode terminals.

The light emitting device 140 may be provided in the cavity 105. The light emitting device 140 may be provided on the first electrode layer 110 and/or the second electrode layer 120. Hereinafter, for the purpose of explanation, a structure in which the light emitting device 140 is provided on the first electrode layer 110 will be described as an example.

The same number of metallic layers may be stacked at portions of the first and second electrode layers 110 and 120. A region of the first electrode layer 110, to which the light emitting device 140 is bonded, serves as a bonding region, and the remaining region of the first electrode layer 110 and the second electrode layer 120 serve as a reflective region.

A reflective metallic layer may be additionally stacked in the reflective region provided inside and outside the cavity 105. The difference of the stack structure may be changed according to a bonding characteristic or a reflective characteristic.

The light emitting device 140 may be provided on a flat top surface of the first electrode layer 110. The region in which the light emitting device 140 is provided may serve as a bonding region. The light emitting device 140 may be bonded to the bonding region by using a paste (not shown) or through a die attach scheme. The light emitting device 140 may include an LED chip such as a blue, green, red, or yellow LED chip having a visible wavelength, or may include an LED chip in an ultraviolet (UV) band, but the embodiment is not limited to the type or the number of the light emitting devices 140.

The light emitting device 140 may be bonded onto the first electrode layer 110 and electrically connected to the first electrode layer 110, and may be connected to the second electrode layer 120 through a wire 142. According to the embodiment, the light emitting device 140 may include an LED chip having a vertical type electrode structure in which electrodes are vertically provided. An LED chip having a lateral type electrode structure may be connected to the first and second electrode layers 110 and 120 through a wire. The light emitting device 140 may employ at least one of a wire, a die bonding scheme, and a flip bonding scheme, but the embodiment is not limited thereto.

The first electrode layer 110 and the second electrode layer 120 may include at least four metallic layers. For example, the bonding region of the first electrode layer 110 may include at least five metallic layers, and the reflective region may include at least one metallic layer formed on the bonding region. The reflective region may be formed in a region onto which light is actually incident, and the bonding region may be formed in a region excluding the reflective region.

The first and second electrode layers 110 and 120 may have a surface roughness of about 30 nm or less (e.g., 0.01 nm to 30 nm), and such a surface roughness can improve a conductive characteristic, a heat dissipation characteristic, and light reflection efficiency.

Referring to FIG. 1, the first and second electrode layers 110 and 120 may have the concave-convex structure 135 by the protrusions 134 of the insulating layer 130. The concave-convex structure 135 is formed on the bottom surface of the cavity 105 excluding a chip mounting region in which the light emitting device 140 is mounted. The concave-convex structure 135 of the first and second electrode layers 110 and 120 is provided around the light emitting device 140 to scatter incident light, so that light efficiency can be improved. The concave-convex structure 135 includes a plurality of protrusions protruding from the electrode layers 110 and 120.

Referring to FIG. 2, a transmissive resin member 150 is formed in the cavity 105, and may have a single layer structure or a multiple layer structure. The transmissive resin member 150 seals or encapsulates the light emitting device 140, and includes resin such as silicon or epoxy. The transmissive resin member 150 may include at least one kind of phosphors, and the phosphors may include red, green, or yellow phosphors, but the embodiment is not limited thereof. The surface of the transmissive resin member 150 may have one of a concave shape, a flat shape, and convex shape.

A lens (not shown) may be formed on the cavity 105, and may include a convex lens shape, a concave lens shape, or the mixture of a convex lens shape and a concave lens shape on the transmissive resin member 150. The lens may be spaced apart from the transmissive resin member 150 or may make contact with the transmissive resin member 150, but the embodiment is not limited thereto. The lens may have various shapes, but the embodiment is not limited thereto.

A fluorescent film including at least one kind of phosphor may be provided on the cavity 105, but the embodiment is not limited thereto. Silicon gel including phosphors or epoxy having superior permeability may be coated on a desired region of the transmissive resin member 150 or on a top surface of the transmissive resin member 150 through a screen printing scheme.

The manufacturing process of the light emitting device package is as follows. After the insulating layer 130 and the first and second electrode layers 110 and 120 have been formed on the package body 101, the light emitting device 140 is electrically connected to the electrode layers 110 and 120. Then, the transmissive resin member 150 is formed in the cavity 105, and the package body 101 is cut in a package unit. The cut surface may be formed at a region excluding the first and second electrode layers 110 and 120.

Figure 3:
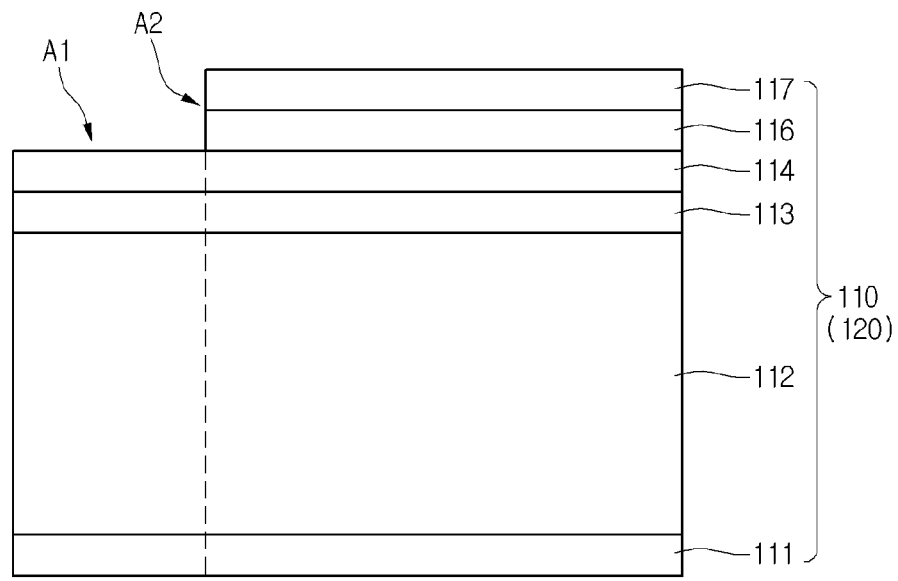
FIG. 3 is a detailed sectional view showing an electrode layer of FIG. 2.

FIG. 3 is a view showing a stack structure of the first and second electrode layers of FIG. 2.

Referring to FIGS. 2 and 3, the first and second electrode layers 110 and 120 include a seed layer 111, a conductive layer 112, a barrier layer 113, a bonding layer 114, an adhesion layer 116, and a reflective layer 117.

A bonding region A1 has a structure in which the seed layer 111, the conductive layer 112, the barrier layer 113, and the bonding layer 114 are sequentially stacked, and the reflective region A2 has a structure in which the seed layer 111, the conductive layer 112, the barrier layer 113, the bonding layer 114, the adhesion layer 116, and the reflective layer 117 are sequentially stacked. The highest layer in the bonding region A1 is the bonding layer 114, and the bonding layer 114 may be formed at the bonding region of an LED chip and at the outer portion of a package.

Since the bonding layer 114 is provided in the bonding region A1, the light emitting device 140 can adhere or be bonded. Since the uppermost layer of the reflective region A2 is the reflective layer 117, the electrode layers 110 and 120 may be provided in the cavity region or at an outer peripheral portion of the cavity region.

The bonding layer 114 and the reflective layer 117 may have surface roughness of about 30 nm or less, and, preferably, may have surface roughness of about 20 nm or less. The surface roughness of the bonding layer 114 may be lower than the surface roughness of the reflective layer 117.

The seed layer 111 is deposited through a physical deposition such as a sputtering scheme or an E-beam deposition scheme. The conductive layer 112, the barrier layer 113, the bonding layer 114, the adhesion layer 116, and the reflective layer 117 are formed through a plating scheme (electroplating or electroless-plating). The seed layer 111 includes a material having higher adhesive property with the insulating layer and higher bonding property with another metal. For example, the seed layer 111 includes titanium (Ti), chromium (Cr), and tantalum (Ta) in a single layer structure or a multiple layer structure. The seed layer 111 may have a thickness of about 900 Å±200 Å.

The seed layer 111 is formed in the cavity 105 of the package body 101, on a top surface of the package body 101, at a lateral surface of the package body 101, and a bottom surface of the package body 101 to effectively dissipate heat emitted from the light emitting device 140.

An intermediate seed layer may be further formed on the seed layer 111, and may include Au or Cu. Therefore, the seed layer 111 may have a structure of Cr/Au, Cr/Cu, Ti/Au, Ta/Cu, and Ta/Ti/Cu. The intermediate seed layer may have a thickness of about 6000 Å±500 Å through a physical deposition scheme.

The conductive layer 112 is formed on the seed layer 111. The conductive layer 112 is formed through a plating scheme, and the plating scheme reduces stress with the seed layer 111 deposited through the physical deposition scheme. The stress reduction can prevent the surface roughness of the conductive layer 112 from being increased. In other words, the conductive layer 112 can prevent the stress occurring due to the difference in a formation method from the seed layer 111.

The surface roughness of the conductive layer 112 is gradually reduced to a predetermined thickness in proportion to the thickness of a plated layer. The conductive layer 112 may include metal, such as Cu, having higher thermal conductivity and a heat dissipation characteristic. The conductive layer 112 may have a thickness of a few tens μm or less, or may have a thickness of about 30 μm or less. Preferably, the conductive layer 112 may have a thickness of 10 μm or less. When the conductive layer 112 has a thickness of a few micrometers (μm), the conductive layer may have surface roughness of 20 nm or less. If the conductive layer 112 has a thickness of 10 μm to 30 μm a heat dissipation characteristic and surface roughness can be improved.

The conductive layer 112 may include materials such as silver (Ag), gold (Au), and aluminum (Al) in addition to copper (Cu). The conductive layer 112 may include Cu-alloy or Ag-alloy.

The barrier layer 113 may be formed on the conductive layer 112. The barrier layer 113 prevents the electrical characteristic of the bonding layer 114 from being reduced due to the conductive layer 112 at a high temperature. The barrier layer 113 may be formed through a plating scheme using platinum (Pt) or nickel (Ni), and may have a thickness of about 3000 Å±500 Å.

The bonding layer 114 is formed on the barrier layer 113. The bonding layer 114 may be formed through a plating scheme using gold (Au), and has a thickness of about 5000±500 Å.

The bonding layer 114 may have a surface roughness of about 30 nm or less. The surface roughness of the bonding layer 114 can improve the bonding between the bonding layer 114 and the paste. As the surface roughness is increased, air is inflows into the bonded interfacial surface between the bonding layer 114 and the paste, so that thermal conductivity may be degraded. Accordingly, the surface roughness of 30 nm or less can improve the bonding property and thermal conductivity.

When the conductive layer 112 includes Cu, the barrier layer 113 includes Ni, and the bonding layer 114 includes Au, the bonding region Al may have a stack structure of Cr/Au/Cu/Ni/Au, Cr/Cu/Cu/Ni/Au, Ti/Au/Cu/Ni/Au, Ta/Cu/Cu/Ni/Au, or Ta/Ti/Cu/Cu/Ni/Au. In the stack structure, the conductive layer 112 is formed at a thickness of 10 μm or less, so that the surface roughness is lowered to 30 nm or less, and the thermal resistance of the metallic layer can be lowered.

The adhesion layer 116 and the reflective layer 117 are stacked on the bonding layer 114. The adhesion layer 116 is formed to bond two adjacent metallic layers to each other, and may include titanium (Ti), chromium (Cr), or tantalum (Ta). The adhesion layer 116 may have a thickness of 900 Å±100 Å. However, the adhesion layer 116 may not be formed.

The reflective layer 117 is formed on the adhesion layer 116. The reflective layer 117 may include metal having superior reflectance to reflect light or alloy thereof. For example, the reflective layer 117 may include Al, Ag, or alloy thereof. The reflective layer 117 is formed on the bottom surface and the lateral surface of the cavity 105 of FIG. 5, so that light reflectance efficiency can be improved. The reflective layer 117 may have a thickness of about 1500±300 Å.

The conductive layer 112 reduces stress transferred from the seed layer 111, so that the surface roughness of the bonding layer 114 and the reflective layer 117 formed on the conductive layer 112 may be 30 nm or less.

The concave-convex structure is formed to at least one part of the seed layer 111, the conductive layer 112, the barrier layer 113, the bonding layer 114, the adhesion layer 116, and a reflective layer 117.

Figure 4:
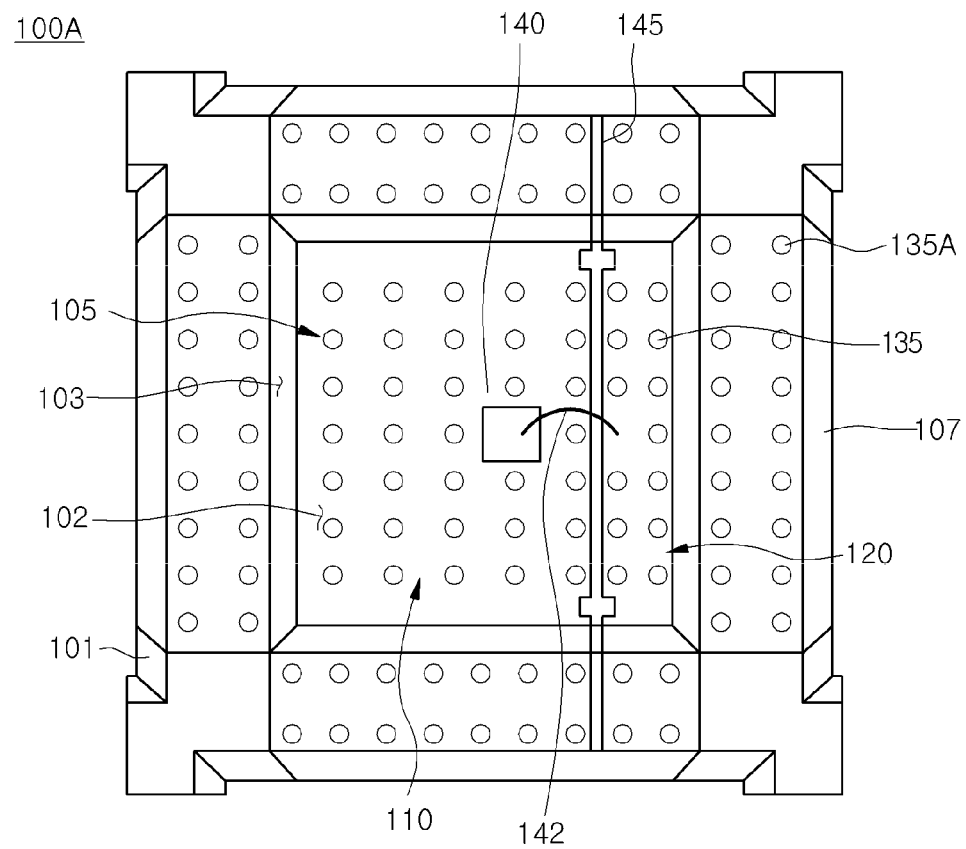
FIG. 4 is a plan view showing a light emitting device package according to a second embodiment.

FIG. 4 is a view showing a light emitting device package 100A according to a second embodiment. Hereinafter, the second embodiment will be described with reference to FIG. 4 while focusing on the difference between the second embodiment and the first embodiment in order to avoid redundancy.

Referring to FIG. 4, the light emitting device package 100A includes the first concave-convex structure 135 formed at a bottom surface 102 of the cavity 105 in the package body 101, and a concave-convex structure 135A formed at a top surface 104 of the package body 101.

A method of forming the first and second concave-convex structures 135 and 135A is considered with reference to the first embodiment. The first concave-convex structure 135 provided on the bottom surface of the cavity 105 scatters light emitted from the light emitting device 140 to improve light efficiency. The second concave-convex structure 135A provided on the top surface 104 of the package body 101 scatters light reflected by a lens, so that light extraction efficiency can be improved.

Figure 5:
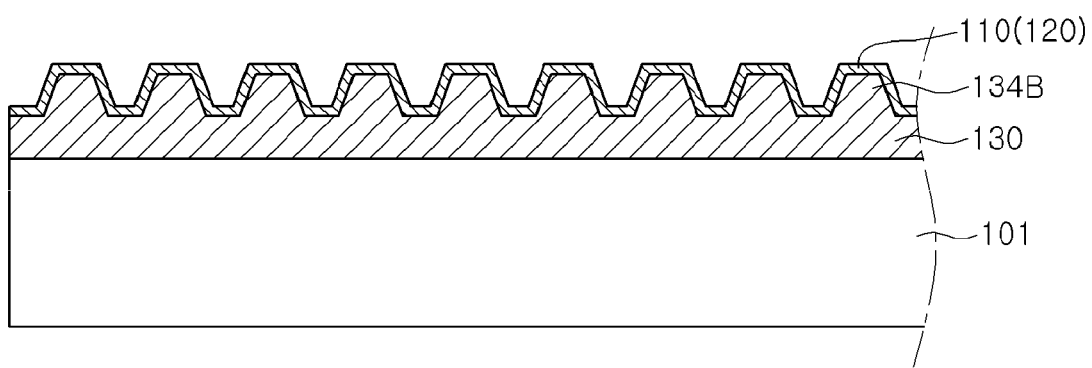
FIG. 5 is a side sectional view showing the modified protrusion according to an embodiment.
Figure 6:
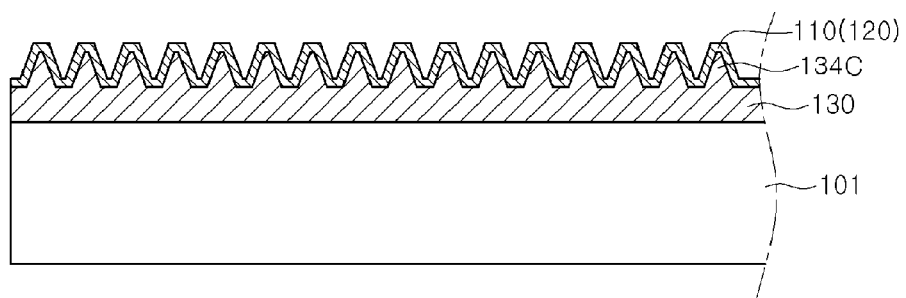
FIG. 6 is a side sectional view showing the modified protrusion according to an embodiment.

FIGS. 5 and 6 are side sectional view showing the modified examples of a protrusion 134B of the insulating layer 130.

Referring to FIG. 5, the protrusion 134B of the insulating layer 130 may have a side section in a prism shape or a polygonal shape. The protrusion 134B may be formed through a photolithography process or a dry and/wet etching process by using the material of the insulating layer 130. The electrode layers 110 and 120 are formed on the insulating layer 130, thereby improving light reflection efficiency.

Referring to FIG. 6, a protrusion 134C of the insulating layer 130 may have a side section in a conical shape or a polygonal pyramid. The protrusion 134C may be formed through a photography process or a dry and/or wet etching process. The electrode layers 110 and 120 are formed on the insulating layer 130, thereby improving light reflective efficiency.

Protrusions of the insulating layer 130 may have the same shape. Portions of the protrusions may have shapes different from each other, but the embodiment is not limited thereto.

According to the embodiment, the cavity may not be formed in the package body 101. In this case, the insulating layer and protrusions thereof may be formed on the flat top surface, and the electrode layer may be formed on the insulating layer.

<Lighting System>

A lighting system according to an embodiment includes a light emitting module in which the light emitting device package of FIG. 1 is arrayed on a board in plurality. In the lighting system, a light unit is provided to display apparatuses for portable terminals, notebook computers, etc., or is variously applicable to lighting apparatuses, indicator apparatuses, etc.

Figure 7:
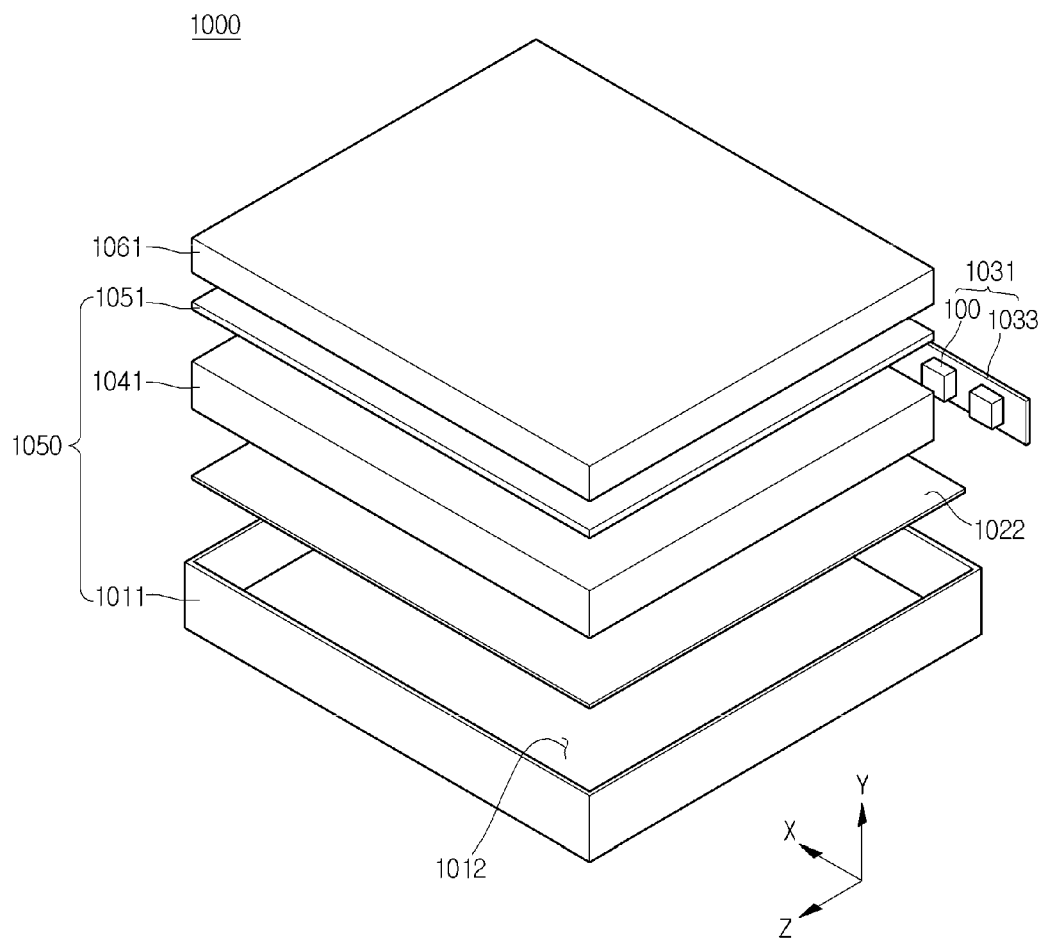
FIG. 7 is a disassembled perspective view of a display apparatus provided with the light emitting device package of FIG. 1.
Figure 8:
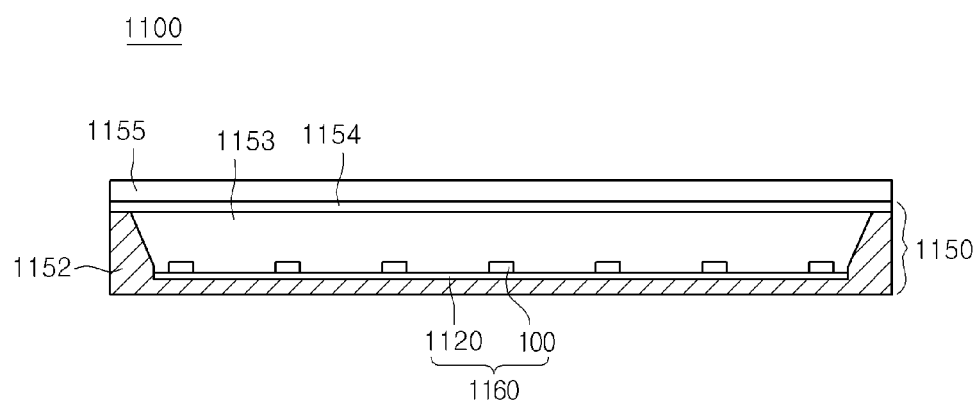
FIG. 8 is a schematic sectional view illustrating another example of a display apparatus provided with the light emitting device package of FIG. 1.
Figure 9:
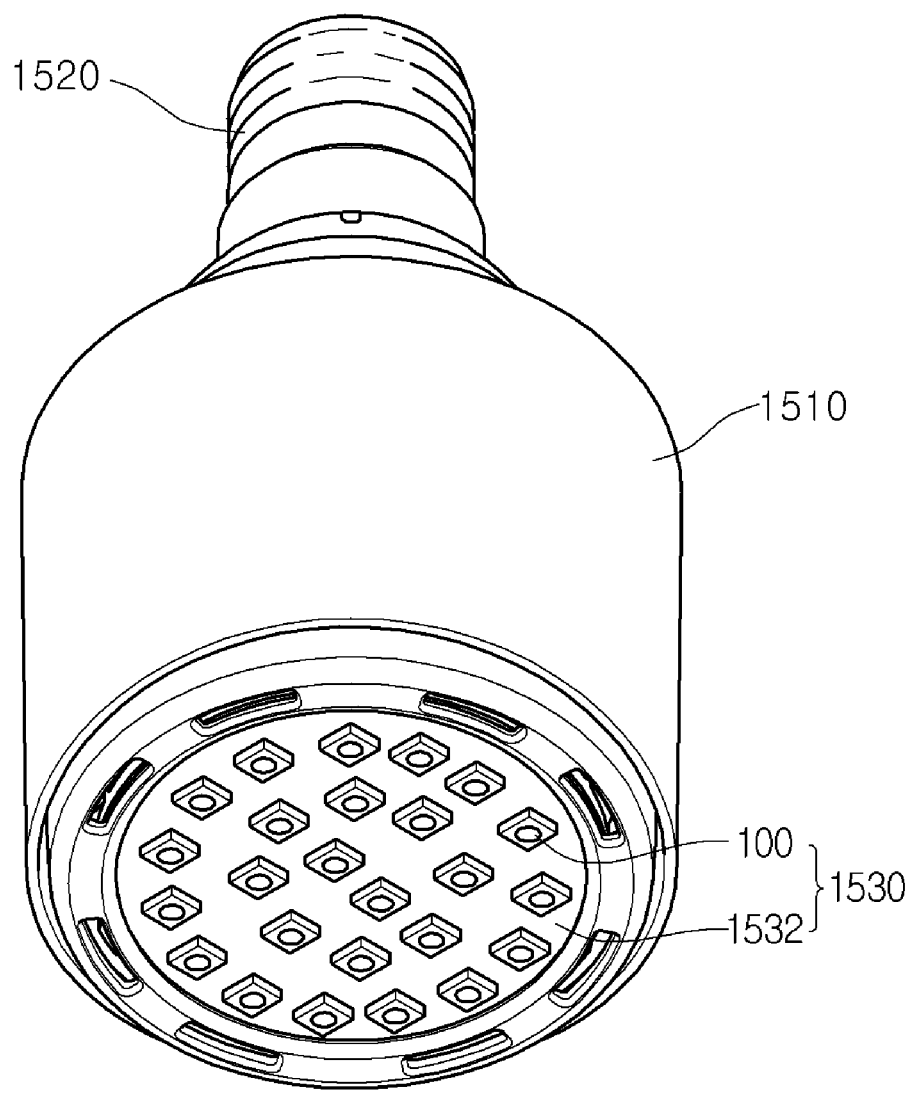
FIG. 9 is a perspective view of a lighting apparatus provided with the light emitting device package of FIG. 1.

The lighting system may include a display apparatus shown in FIGS. 7 and 8, a light unit shown in FIG. 9, in addition to a lighting lamp, a signal light, a vehicle headlight, an electronic display, etc.

FIG. 7 is a disassembled perspective view of a display apparatus according to an embodiment.

Referring to FIG. 7, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present invention is not limited thereto.

The bottom cover 1011, the reflective sheet 1022, the light guide panel 1041, and the optical sheet 1051 may be defined as a light unit 1050.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), Cyclic Olefin Copolymer (COC), and polyethylene naphthalate resin.

The light emitting module 1031 provides light to at least a side surface of the light guide panel 1041, and ultimately acts as a light source of a display apparatus.

The light emitting module 1031 may include at least one light emitting device, and provide light directly or indirectly from one side surface of the light guide panel 1041. The light emitting module 1031 may include a board 1033, and a light emitting device package 100 according to embodiments disclosed above, and the light emitting device packages 100 may be arrayed apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present invention is not limited thereto. In the case where the light emitting device package 100 is mounted on a side surface or a heat releasing plate, the board 1033 may be removed. Herein, some of the heat releasing plate may contact an upper surface of the bottom cover 1011.

The plurality of light emitting device packages 100 may be mounted on the board 1033 such that light emitting surfaces of the plurality of light emitting device packages 100 are spaced apart by a predetermined distance from the light guide panel 1041, but the present invention is not limited thereto. The light emitting device package 100 may supply light to a light incident part that is one side surface of the light guide panel 1041, directly or indirectly, but the present invention is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, polyethylene terephthalate (PET), polycarbonate (PC), polyvinyl chloride (PVC) resin, or the like, but the present invention is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present invention is not limited thereto. The bottom cover 1011 may be coupled to a top cover, but the present invention is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present invention is not limited thereto.

The display panel 1061 is, for example, an LCD panel, and includes first and second transparent substrates facing each other, and a liquid crystal layer interposed between the first and second substrates. A polarizing plate may be attached over at least one surface of the display panel 1061, but the present invention is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present invention is not limited thereto.

Herein, the display apparatus 1000 may include the light guide panel 1041 and the optical sheet 1051 as optical members positioned on a light path of the light emitting module 1031, but the present invention is not limited thereto.

FIG. 8 is a cross-sectional view of a display apparatus according to an embodiment.

Referring to FIG. 8, the display apparatus 1100 includes a bottom cover 1152, a board 1120 on which the light emitting device packages 100 disclosed above are arrayed, an optical member 1154, and a display panel 1155.

The board 1120 and the light emitting device package 100 may be defined as a light emitting module 1060. The bottom cover 1152, the at least one light emitting module 1060, and the optical member 1154 may be defined as a light unit 1150.

The bottom cover 1152 may be provided with a receiving part 1153, but the present invention is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 1154 transforms light emitted from the light emitting module 1060 to planar light, and performs diffusion, light focusing, and the like.

FIG. 9 is a perspective view of a lighting unit according to an embodiment.

Referring to FIG. 9, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 100 according to the embodiments mounted on the board 1532. The light emitting device package 100 may include a plurality of light emitting device packages which are arrayed apart by a predetermined distance from one another in a matrix configuration.

The board 1532 may be an insulator substrate on which a circuit pattern is printed, and may include, for example, a general printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 100 may be mounted on the board 1532. Each of the light emitting device packages 100 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CR1).

The connection terminal 1520 may be electrically connected to the light emitting module 1530 to supply power. The connection terminal 1520 may be screwed and coupled to an external power in a socket type, but the present invention is not limited thereto. For example, the connection terminal 1520 may be made in a pin type and inserted into an external power, or may be connected to the external power through a power line.

A light emitting module of a light unit includes the light emitting device package. The light emitting device package may have the above disclosed package structure. In addition, after mounting the light emitting devices having lateral-type and vertical-type electrode structures on a substrate, the resultant structure is packaged by using a molding member.

According to the embodiment, a method of manufacturing a light emitting device package includes steps of forming an insulating layer on a surface of a package body, forming a plurality of protrusions in a first region of the insulating layer, forming a plurality of metallic layers on the insulating layer, and connecting the light emitting device with the metallic layers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
    a package body including a cavity recessed from a top surface of the package body;
    a nonconductive layer on a surface of the package body, and including a plurality of protrusions protruded from the nonconductive layer in the cavity;
    a plurality of electrodes on the nonconductive layer that follow a contour of the plurality of protrusions in the cavity; and
    a light emitting device disposed on at least one of the plurality of electrodes in the cavity and connected to the plurality of electrodes,
    wherein the nonconductive layer includes a lower surface contacted with a surface of the package body in the cavity and a top surface having the plurality of protrusions protruded in a direction toward the plurality of electrodes,
    wherein the plurality of protrusions in the cavity have a height lower than a height of a top surface of the light emitting device,
    wherein the light emitting device is a light emitting diode chip,
    wherein the plurality of electrodes are spaced apart from each other in a bottom region of the cavity, and
    wherein a region of one of the plurality of electrodes that is bonded with the light emitting device has a flat top surface.

2. The light emitting device package of claim 1, wherein the plurality of electrodes include:
    a seed layer formed on the nonconductive layer;
    a conductive layer formed on the seed layer;
    a barrier layer formed on the conductive layer; and
    a bonding layer formed on the barrier layer,
    wherein the seed layer, the conductive layer, the barrier layer, and the bonding layer have a concave-convex structure by the contour of the plurality of protrusions of the nonconductive layer.

3. The light emitting device package of claim 2, wherein the bonding layer includes:
    an adhesive layer disposed on the bonding layer; and
    a reflective layer disposed on the adhesive layer,
    wherein the adhesive layer and the reflective layer have a concave-convex structure by the contour of the plurality of protrusions of the nonconductive layer,
    wherein the reflective layer is spaced apart from a region of the cavity where the light emitting device is disposed.

4. The light emitting device package of claim 1, further comprising a concave-convex structure formed at the plurality of electrodes which is disposed at the top surface of the package body.

5. The light emitting device package of claim 1, wherein the package body includes a silicon-based material.

6. The light emitting device package of claim 1, further comprising a transmissive resin member formed in the cavity and contacted with the plurality of electrodes.

7. The light emitting device package of claim 1, wherein the nonconductive layer is disposed between the package body and the plurality of electrodes, and
    wherein the lower surface of the nonconductive layer corresponding to the bottom region of the cavity is substantially flat.

8. The light emitting device package of claim 7, wherein an entire surface of the package body in the bottom region of the cavity is substantially flat.

9. A light emitting device package comprising:
    a package body including a cavity recessed from a top surface of the package body;
    a nonconductive layer formed on a surface of the package body;
    a plurality of electrodes on the nonconductive layer;
    a plurality of first protrusions on a bottom region of the cavity;
    a light emitting device disposed on the plurality of electrodes; and
    a transmissive resin to encapsulate the light emitting device,
    wherein the nonconductive layer is disposed between the package body and the plurality of electrodes,
    wherein an entire lower surface of the nonconductive layer corresponding to the bottom region of the cavity is substantially flat, wherein the plurality of first protrusions has a height lower than a height of a top surface of the light emitting device in which the light emitting device is a light emitting diode chip, wherein the plurality of electrodes are spaced apart from each other in the bottom region of the cavity.

10. The light emitting device package of claim 9, wherein the plurality of electrodes includes a first electrode disposed under the light emitting device and a second electrode spaced apart from the first electrode in the cavity, and wherein the first electrode has a flat first region under the light emitting device and a second region having a concave-convex structure on the bottom region of the cavity.

11. The light emitting device package of claim 9, further comprising a plurality of second protrusions protruded from the nonconductive layer and corresponding to the plurality of first protrusions.

12. The light emitting device package of claim 9, wherein the plurality of second protrusions of the nonconductive layer are formed at a regular interval or an irregular interval.

13. The light emitting device package of claim 9, wherein the plurality of electrodes includes at least four layers.

14. The light emitting device package of claim 13, wherein the plurality of electrodes includes a metal layer formed at a thickness of about 10 μm-30 μm.

15. The light emitting device package of claim 11, wherein the plurality of second protrusions of the nonconductive layer have a thickness less than or equal to a thickness of the light emitting device, and have a section having at least one of a lens shape, a pyramid shape, and a polygonal shape.

16. The light emitting device package of claim 11, wherein a top surface of the nonconductive layer disposed on the top surface of the package body has a plurality of third protrusions.

* * * * *